(12) United States Patent
Lee et al.

(10) Patent No.: US 10,509,283 B2
(45) Date of Patent: Dec. 17, 2019

(54) DISPLAY DEVICE INCLUDING NON-OVERLAPPING REGION OF FIRST AND SECOND POLARIZERS

(71) Applicant: Samsung Display Co., Ltd., Yongin-si, Gyeonggi-do (KR)

(72) Inventors: Jun Woo Lee, Seongnam-si (KR); Keun Chan Oh, Hwaseong-si (KR); Woo Suk Jung, Yongin-si (KR); Yi Seop Shim, Suwon-si (KR); Sun Kyu Joo, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/867,396

(22) Filed: Jan. 10, 2018

(65) Prior Publication Data

US 2019/0033671 A1 Jan. 31, 2019

(30) Foreign Application Priority Data

Jul. 26, 2017 (KR) ........................ 10-2017-0094504

(51) Int. Cl.
*G02F 1/136* (2006.01)
*G02F 1/133* (2006.01)
(Continued)

(52) U.S. Cl.
CPC ...... *G02F 1/136209* (2013.01); *G02F 1/1339* (2013.01); *G02F 1/1368* (2013.01);
(Continued)

(58) Field of Classification Search
CPC ......... G02F 1/136209; G02F 1/133528; G02F 1/1339; G02F 1/136286; G02F 1/368;
(Continued)

(56) References Cited

U.S. PATENT DOCUMENTS

2008/0265764 A1* 10/2008 Kim .................... H01L 51/5246
313/504
2010/0065850 A1* 3/2010 Kwak ............... G02F 1/136227
257/72
(Continued)

FOREIGN PATENT DOCUMENTS

KR 10-2002-0040997 5/2002
KR 10-2004-0061601 7/2004
(Continued)

*Primary Examiner* — Didarul A Mazumder
(74) *Attorney, Agent, or Firm* — Innovation Counsel LLP

(57) ABSTRACT

Provided is a display device. The display device includes a first substrate and a second substrate including a display area and a non-display area surrounding the display area. The first substrate and the second substrate face and are attached to each other. A first polarizer is disposed on the display area of the first substrate. A second polarizer is entirely disposed on the display area and the non-display area of the second substrate and has a non-overlapping region which does not overlap the first polarizer in the non-display area. A light leakage prevention pattern is disposed between the first substrate and the second substrate in the non-overlapping region of the first polarizer and the second polarizer and includes a color filter pattern and a light blocking pattern which overlap each other.

18 Claims, 14 Drawing Sheets

(51) Int. Cl.
  *G02F 1/1362* (2006.01)
  *G02F 1/1335* (2006.01)
  *G02F 1/1339* (2006.01)
  *H01L 27/12* (2006.01)
  *G02F 1/1368* (2006.01)

(52) U.S. Cl.
  CPC .. *G02F 1/133528* (2013.01); *G02F 1/136286* (2013.01); *H01L 27/124* (2013.01); *H01L 27/1248* (2013.01); *G02F 2001/136222* (2013.01); *G02F 2202/022* (2013.01)

(58) Field of Classification Search
  CPC ... G02F 2001/136222; G02F 2202/022; H01L 27/124; H01L 127/1248
  USPC ..... 257/72; 438/48, 128, 149, 151, 157, 283
  See application file for complete search history.

(56) References Cited

U.S. PATENT DOCUMENTS

| | | | |
|---|---|---|---|
| 2011/0222013 A1* | 9/2011 | Kawanishi | G02F 1/1339 349/153 |
| 2016/0139455 A1* | 5/2016 | Yu | G02F 1/133512 349/42 |
| 2017/0338246 A1* | 11/2017 | Kubota | G02F 1/133305 |

FOREIGN PATENT DOCUMENTS

| KR | 10-2004-0082676 | 9/2004 |
|---|---|---|
| KR | 10-2013-0015734 | 2/2013 |
| KR | 10-2017-0005208 | 1/2017 |
| KR | 10-2017-0038963 | 4/2017 |

\* cited by examiner

DISPLAY DEVICE INCLUDING NON-OVERLAPPING REGION OF FIRST AND SECOND POLARIZERS This application claims priority from Korean Patent Application No. 10-2017-0094504 filed on Jul. 26, 2017 in the Korean Intellectual Property Office, the disclosure of which is incorporated herein by reference in its entirety.

BACKGROUND

1. Field

The present application relates to a display device.

2. Description of the Related Art

Among display devices, a liquid crystal display, as one of the most widely used flat panel display devices, is a display device in which a voltage is applied to electrodes (a pixel electrode and a common electrode) formed on two substrates facing each other to control the arrangement of liquid crystal molecules in a liquid crystal layer interposed therebetween, thereby adjusting an amount of light transmitted.

Such a liquid crystal display includes a non-light emitting element in which a liquid crystal panel including the substrates cannot emit light by itself, and thus a backlight unit for supplying light to the liquid crystal panel is required. Further, polarizers having transmission axes perpendicular to each other are attached to the outsides of the substrates of the liquid crystal panel. The polarizers may be divided into a first polarizer disposed below the liquid crystal panel and a second polarizer disposed on the liquid crystal panel.

Meanwhile, a middle cover supporting a liquid crystal panel may be disposed between the liquid crystal panel and a backlight unit. The middle cover is disposed to cover a lower edge region and a side portion of the liquid crystal panel.

As such, when the middle cover is disposed between the liquid crystal panel and the backlight unit, a first polarizer is disposed so as not to overlap a middle frame in order to implement slimness of the liquid crystal display. As a result, a non-overlapping region of the first polarizer and the second polarizer is generated at the edge of the liquid crystal panel.

However, in the non-overlapping region of the first polarizer and the second polarizer, light leakage occurs and thus, the quality of the liquid crystal display may be deteriorated.

SUMMARY

An aspect of the inventive concept is to provide a display device capable of improving display quality by reducing the occurrence of light leakage in a non-overlapping region of a first polarizer and a second polarizer.

However, aspects of the inventive concept are not restricted to the one set forth herein. The above and other aspects of the inventive concept will become more apparent to one of ordinary skill in the art to which the inventive concept pertains by referencing the detailed description given below.

In accordance with one embodiment, a display device comprises: a first substrate and a second substrate including a display area and a non-display area surrounding the display area. The first substrate and the second substrate faced and are attached to each other. A first polarizer is disposed on the display area of the first substrate. A second polarizer is entirely disposed on the display area and the non-display area of the second substrate and has a non-overlapping region which does not overlap the first polarizer in the non-display area. A light leakage prevention pattern is disposed between the first substrate and the second substrate in the non-overlapping region of the first polarizer and the second polarizer and includes a color filter pattern and a light blocking pattern which overlap each other.

The color filter pattern may completely overlap the light blocking pattern, and an end portion of the first polarizer may overlap the color filter pattern.

A separation distance between the end portion of the first polarizer and an end portion of the color filter pattern which face each other may be about 0.5 mm or less.

The color filter pattern may be one of a blue color filer, a green color filter, a blue color filter and a green color filter overlapping each other, and a blue color filter and a red color filter overlapping each other.

The display device may further comprise a sealing member disposed between the first substrate and the second substrate in the non-display area and attaching the first substrate and the second substrate to each other.

The sealing member may be disposed outside the color filter pattern and may not overlap the color filter pattern.

The sealing member may be disposed outside the light blocking pattern, may overlap the color filter pattern, and may not overlap the light blocking pattern.

The color filter pattern and the light blocking pattern may directly contact each other, or a protective layer may be disposed between the color filter pattern and the light blocking pattern.

The display device may further comprise: a gate wiring disposed on the display area of the first substrate and a data wiring insulatively crossing the gate wiring; a switching element disposed on the display area of the first substrate and connected with the gate wiring and the data wiring; a passivation layer disposed on the switching element; a first electrode disposed on the passivation layer and connected to the switching element; a color filter disposed between the first substrate and the first electrode and overlapping the first electrode; and a protective layer disposed between the color filter and the first electrode.

The color filter may be one of a red color filter, a green color filter, and a blue color filter, and the color filter pattern may be formed of a same material as the color filter.

The display device may further comprise a light blocking member which is disposed on the protective layer, overlaps the switching element, and is made of a same material as the light blocking pattern.

The light blocking member may include an epoxy acrylate-based polymer.

The light blocking member may include a cardo-based polymer and an acrylate-based polymer.

The display device may further comprise a light blocking member which is disposed on the second substrate, overlaps the switching element, and is made of a same material as the light blocking pattern.

The light blocking pattern may have a thickness of about 2.9 μm to about 3.8 μm and the color filter pattern may have a thickness of about 2.2 μm to about 2.6 μm.

The display device may further comprise a middle cover including a bottom portion covering a part of a lower portion of the first substrate and the second substrate bonded to each other and a side wall portion covering a side portion of the first substrate and the second substrate bonded to each other, wherein an end portion of the bottom portion and an end portion of the first polarizer may be spaced apart from each other.

In accordance with another embodiment, a display device comprises: a first substrate including a display area and a non-display area surrounding the display area; a first polarizer disposed on the display area of the first substrate; and a light leakage prevention pattern disposed outside the first polarizer on the non-display area of the first substrate and including a color filter pattern and a light blocking pattern overlapping each other.

The color filter pattern may completely overlap the light blocking pattern and an end portion of the first polarizer may overlap the color filter pattern.

A separation distance between an end portion of the first polarizer and an end portion of the color filter pattern which face each other may be about 0.5 mm or less.

The color filter pattern may be one of a blue color filer, a green color filter, a blue color filter and a green color filter overlapping each other, and a blue color filter and a red color filter overlapping each other.

BRIEF DESCRIPTION OF THE DRAWINGS

The above and other aspects and features of the inventive concept will become more apparent by describing in detail exemplary embodiments thereof with reference to the attached drawings, in which.

DETAILED DESCRIPTION OF THE EMBODIMENTS

Figure 1:
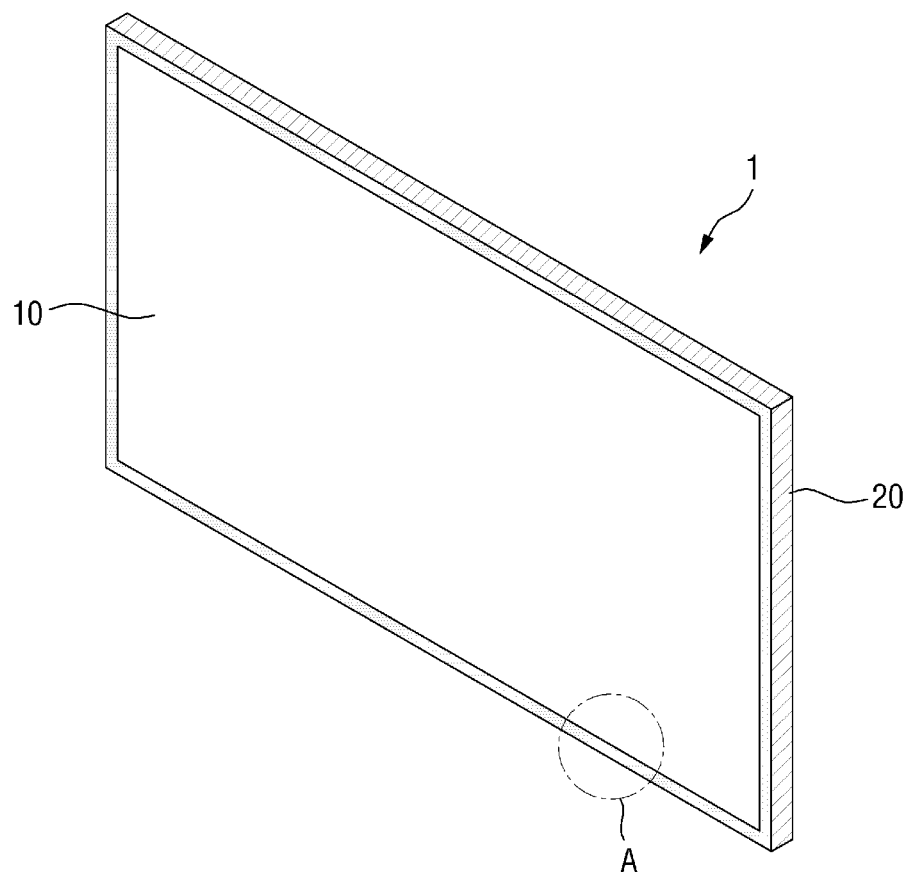
FIG. 1 is a perspective view schematically illustrating an appearance of a display device according to an exemplary embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims.

It will also be understood that when a layer is referred to as being "on" another layer or substrate, it can be directly on the other layer or substrate, or intervening layers may also be present. The same reference numbers indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept.

Singular expressions used herein include plurals expressions unless they have definitely opposite meanings. Further, unless explicitly described to the contrary, the terms of "include" or "have" will be understood to imply the inclusion of stated components but not the exclusion of any other elements.

In the drawings, for convenience of description, components may be exaggerated or reduced in size.

Like reference numerals designate like or similar elements throughout the specification.

Hereinafter, exemplary embodiments will be described with reference to the accompanying drawings.

Figure 2:
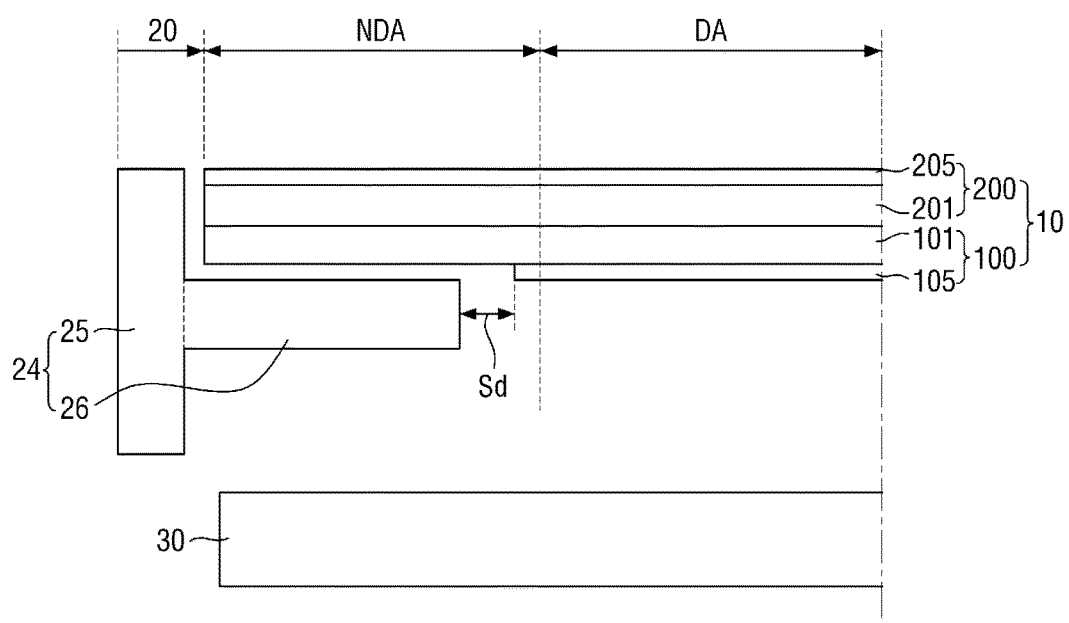
FIG. 2 is a cross-sectional view schematically illustrating a portion A of FIG. 1.

FIG. 1 is a perspective view schematically illustrating an appearance of a display device 1 according to an exemplary embodiment and FIG. 2 is a cross-sectional view schematically illustrating a portion A of FIG. 1.

Referring to FIG. 1, the display device 1 according to the exemplary embodiment may include a display panel 10 and an external cover 20.

Referring to FIG. 2, the display panel 10 may include a first display panel 100 and a second display panel 200. Hereinafter, a case where the display panel 10 is a display panel of a liquid crystal display will be described as an example.

Figure 3:
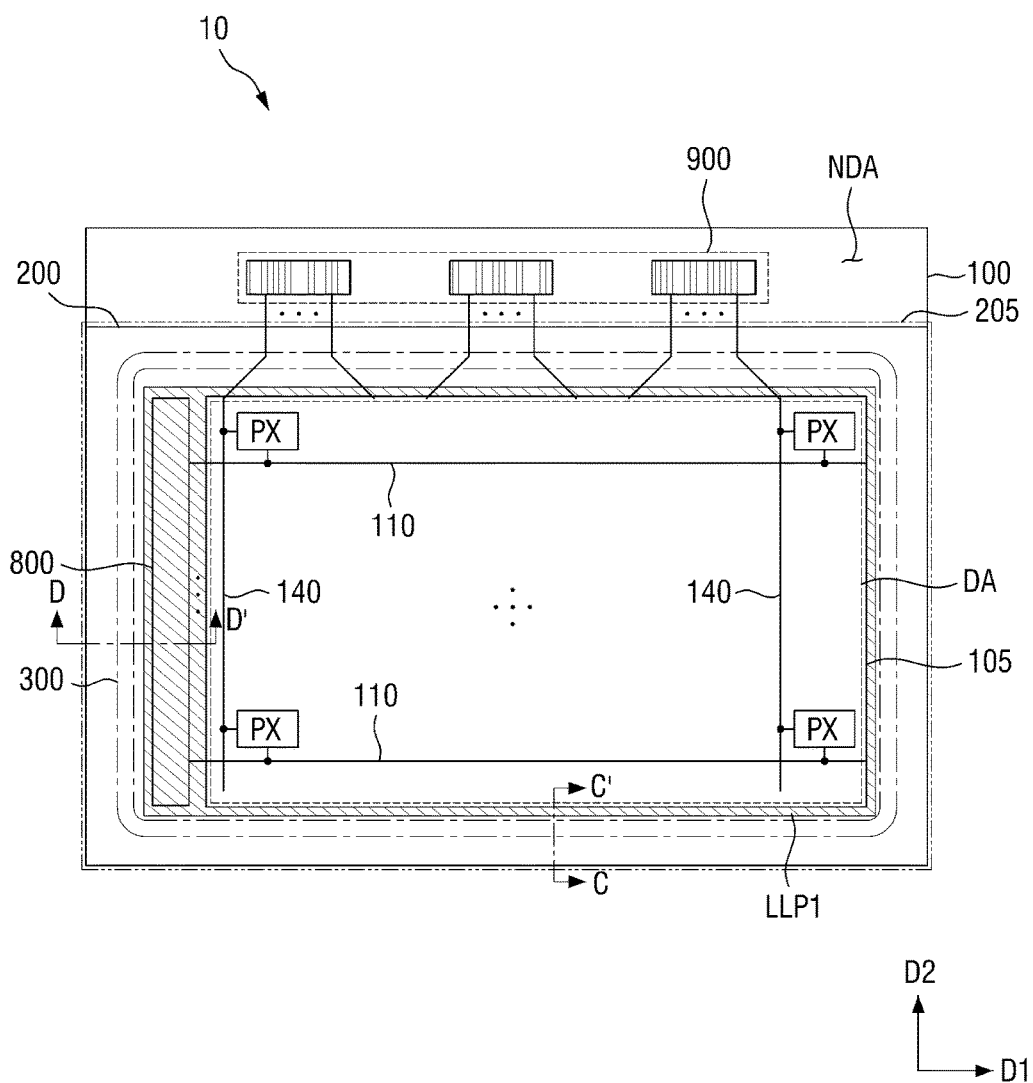
FIG. 3 is a plan view of the display device according to the exemplary embodiment.

The first display panel 100 may include a display area DA and a non-display area NDA surrounding the display area DA (see FIG. 3). The display area DA is an area where an image is embodied, and the non-display area NDA is an area where the image is not embodied. The first display panel 100 may include a first substrate 101 and a first polarizer 105. The first polarizer 105 may be disposed on the display area DA of the first substrate 101. Illustratively, the first polarizer 105 may be disposed on the first substrate 101 to cover a part of the non-display area NDA of the first substrate 101.

The second display panel 200 faces the first display panel 100 and may include a second substrate 201 and a second polarizer 205. The second polarizer 205 may be entirely disposed on the display area DA and the non-display area NDA of the second substrate 201. Accordingly, in the non-display area NDA, a non-overlapping region where the first polarizer 105 and the second polarizer 205 do not overlap each other may be formed.

A backlight unit 30 supplying light to the first display panel 100 may be disposed below the first display panel 100. The backlight unit 30 may include a light source module, an optical sheet, and a lower cover covering the light source module and the optical sheet.

Figure 5:
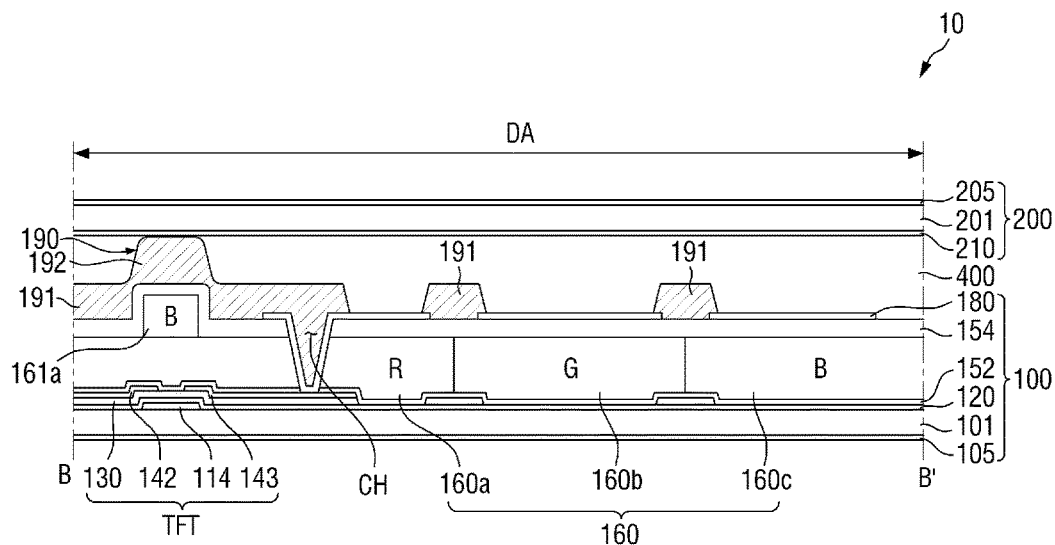
FIG. 5 is a cross-sectional view taken along the line B-B' of FIG. 4.
Figure 6:
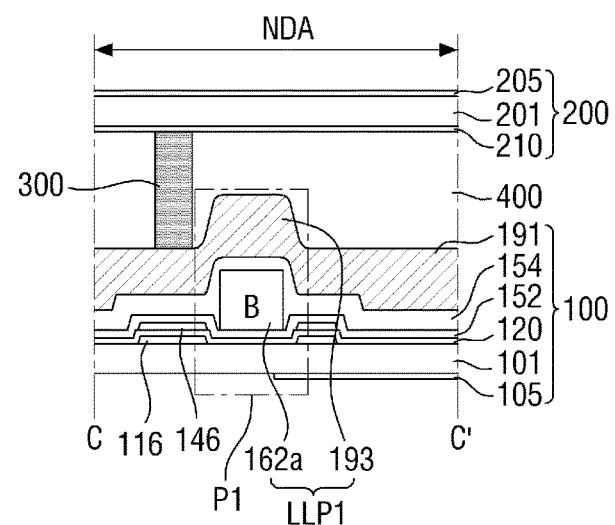
FIG. 6 is a cross-sectional view taken along the line C-C' of FIG. 3.

Although not illustrated in FIG. 2, the first substrate 101 and the second substrate 201 facing each other may be attached to each other by a sealing member 300 (see FIG. 6). A liquid crystal layer 400 (see FIG. 5) may be disposed between the first substrate 101 and the second substrate 201 attached to each other by the sealing member 300 (see FIG. 6).

Meanwhile, the external cover 20 may include a middle cover 24 disposed between the display panel 10 and the backlight unit 30.

The middle cover 24 may include a bottom portion 26 covering a part of the lower portions of the first substrate 101 and the second substrate 201 which are attached to each other and a side wall portion 25 covering side portions of the first substrate 101 and the second substrate 201 which are attached to each other.

The bottom portion 26 of the middle cover 24 may be disposed in the non-overlapping region where the first polarizer 105 and the second polarizer 205 do not overlap each other in the non-display area NDA, in order to implement the slimness of the display device 1. At this time, an open region Sd may be formed between the end of the bottom portion 26 and the end of the first polarizer 105 which face each other. That is, the end of the bottom portion 26 and the end of the first polarizer 105 may be spaced apart from each other.

Such an open region Sd transmits the light provided from the backlight unit 30 to the display panel 100 to generate light leakage at the edge of the display device 1. Accordingly, in order to reduce the generation of light leakage at the edge of the display device 1, in the exemplary embodiment, a light leakage preventing pattern LLP1 (see FIG. 3) is disposed in the non-overlapping region of the first polarizer 105 and the second polarizer 205. The light leakage preventing pattern LLP1 will be described below.

FIG. 3 is a plan view of the display device according to the exemplary embodiment. In FIG. 3, the backlight unit 30 of FIG. 2 and the external cover 20 of FIG. 1 will be omitted.

Referring to FIG. 3, the first display panel 100 may be a panel in which a switching element, for example, thin film transistors for driving liquid crystal molecules of the liquid crystal layer 400 (see FIG. 5) and a pixel electrode are formed.

In the display area DA of the first display panel 100, a gate wiring 110, a data wiring 140, and a pixel element PX connected to the gate wiring 110 and the data wiring 140 are disposed. Further, the first polarizer 105 is disposed in the display area DA of the first display panel 100.

In the non-display area NDA of the first display panel 100, a gate driver 800, a data driver 900, and the sealing member 300 may be disposed. The light leakage prevention pattern LLP1 is disposed at the outside of the first polarizer 105 in the non-display area NDA of the first display panel 100.

The gate driver 800 is a portion for providing a gate signal to the gate wiring 110. In some exemplary embodiments, the gate driver 800 may be embodied by an amorphous silicon gate (ASG) which is integrally formed in the non-display area NDA, but is not limited thereto. When the gate driver 800 is embodied by the ASG method, a plurality of wirings are patterned and arranged in a region where the gate driver 800 is formed.

The data driver 900 is a portion for providing a data voltage to the data wiring 140. In some exemplary embodiments, the data driver 900 may be formed in a chip on glass (COG) structure. Alternatively, in some exemplary embodiments, the data driver 900 may also be formed in a tape carrier package (TCP) or chip on film (COF) structure.

A plurality of gate wirings 110 is provided to be extended in a first direction D1. The gate wirings 110 are connected to the gate driver 800 disposed in the non-display area NDA to receive a gate signal to the gate driver 800.

A plurality of data wirings 140 is provided to be extended in a second direction D2 crossing the first direction D1. The data wiring 140 is insulated from the gate wiring 110. The data wirings 140 are connected to the data driver 900 disposed in the non-display area NDA to receive a data voltage to the data driver 900.

The plurality of pixel elements PX is disposed in the display area DA and connected to the gate wiring 110 and the data wiring 140.

The sealing member 300 is disposed in the non-display area NDA of the first display panel 100. Although not illustrated, a voltage line and the like may be disposed at the outside of the sealing member 300.

The second display panel 200 may be a panel having a common electrode 210 described below. The common electrode 210 may be entirely disposed in the display area DA and the non-display area NDA of the second display panel 200. Further, the second polarizer 205 may be entirely disposed in the display area DA and the non-display area NDA of the second display panel 200.

Hereinafter, the display device 1 will be described in more detail with reference to FIGS. 4 to 10.

Figure 4:
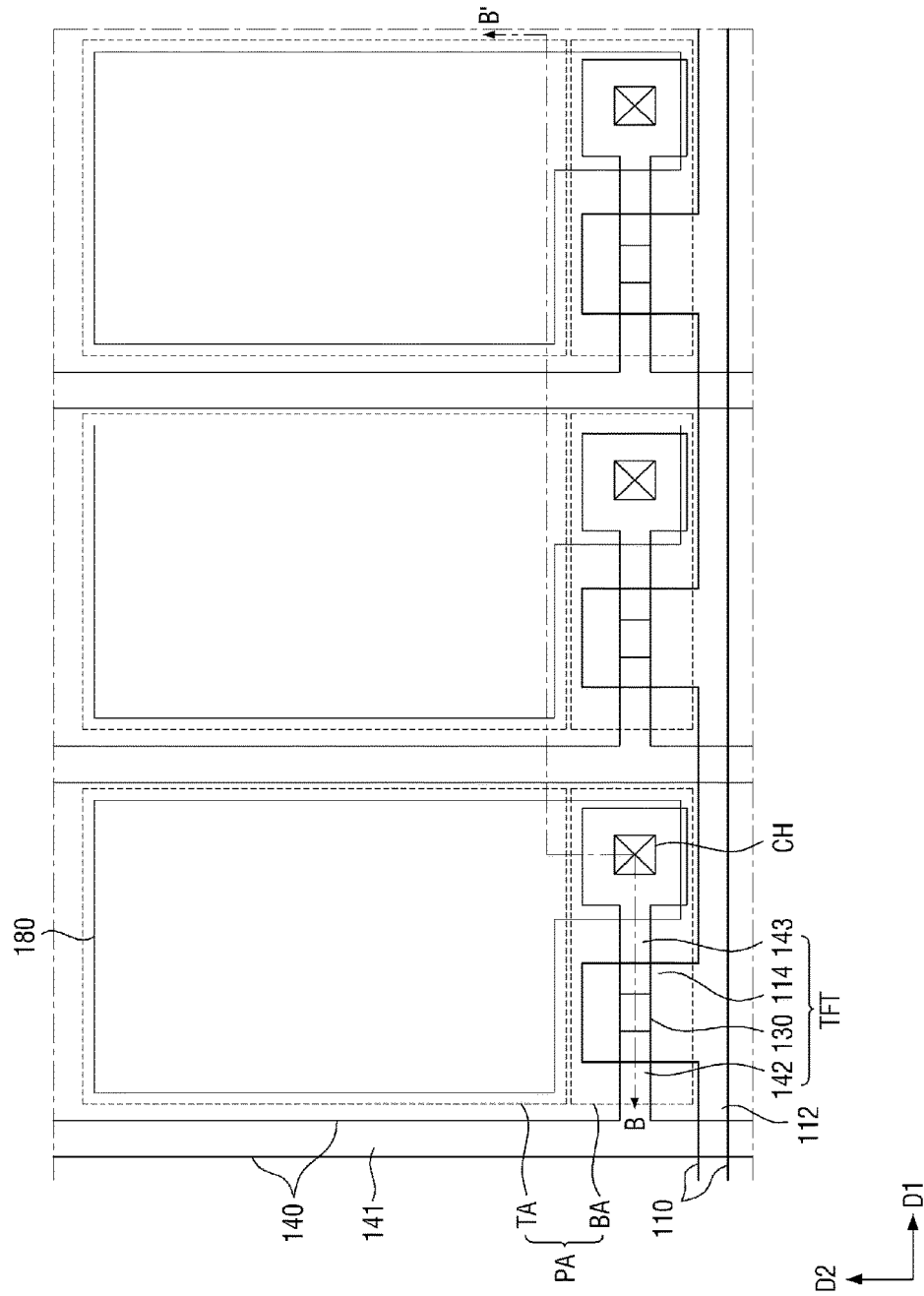
FIG. 4 is a plan view illustrating a pixel element portion of FIG. 3.
Figure 7:
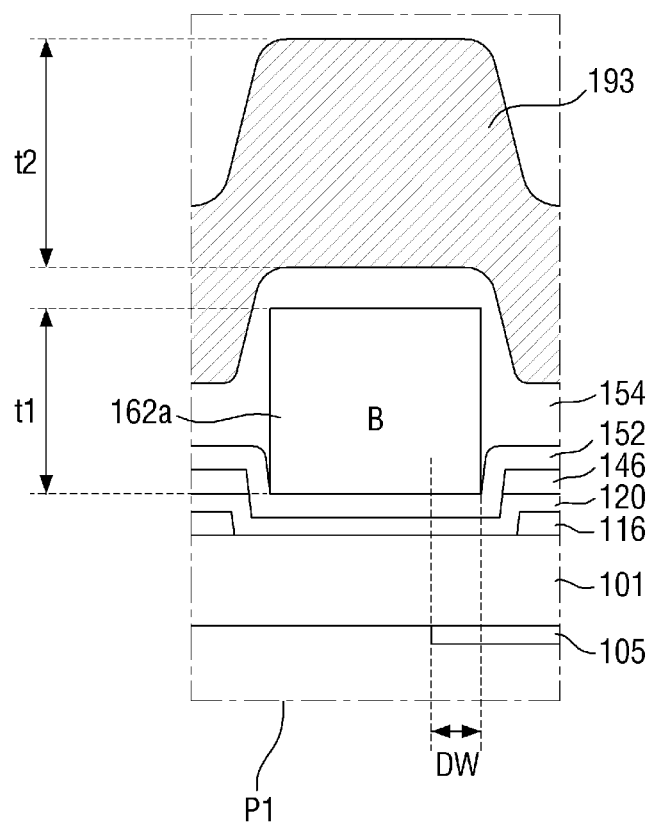
FIG. 7 is a cross-sectional view enlarging a portion P1 of FIG. 6.
Figure 8:
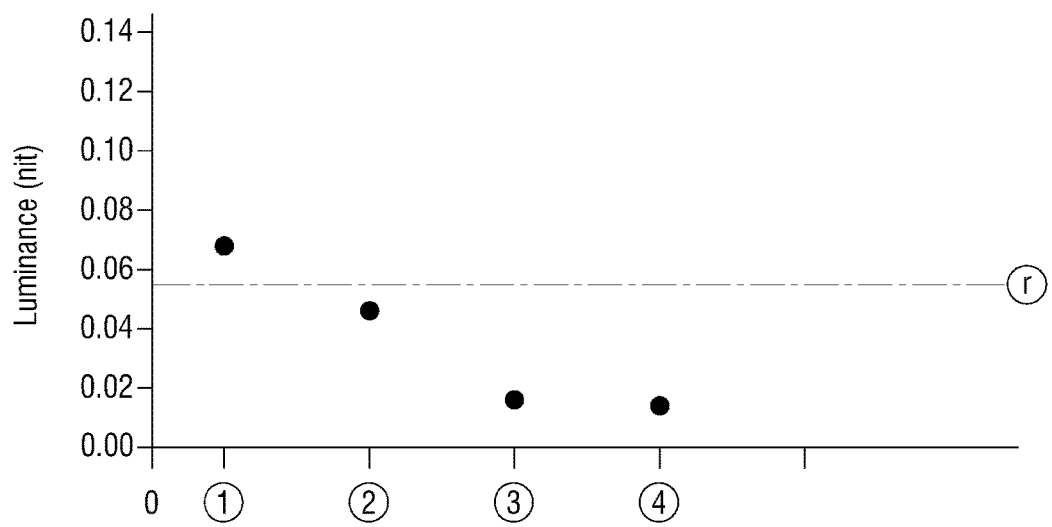
FIG. 8 is a diagram illustrating luminance when a color filter pattern of a light leakage prevention pattern includes a red color filter, a green color filter, and a blue color filter and when the color filter pattern includes a blue color filter and a red color filter overlapping each other, respectively.
Figure 9:
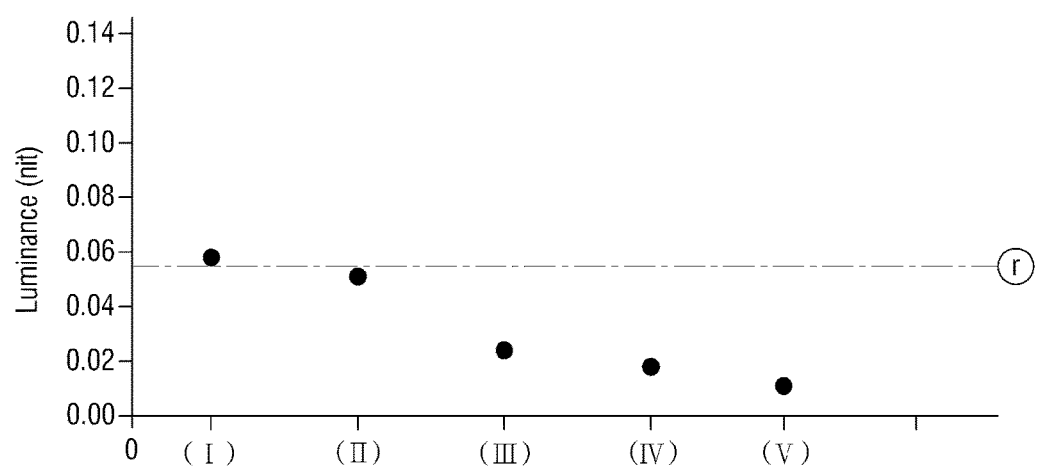
FIG. 9 is a diagram illustrating luminance for each thickness of a light blocking pattern of the light leakage prevention pattern.
Figure 10:
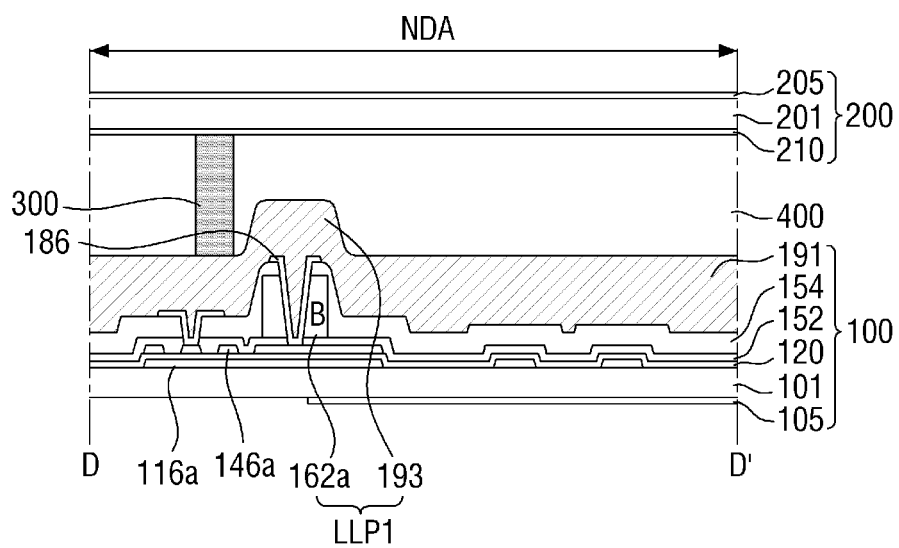
FIG. 10 is a cross-sectional view taken along the line D-D' of FIG. 3.

FIG. 4 is a plan view illustrating a pixel element portion of FIG. 3. FIG. 5 is a cross-sectional view taken along the line B-B' of FIG. 4. FIG. 6 is a cross-sectional view taken along the line C-C' of FIG. 3. FIG. 7 is a cross-sectional view enlarging a portion P1 of FIG. 6. FIG. 8 is a diagram illustrating luminance when a color filter pattern of a light leakage prevention pattern includes a red color filter, a green color filter, and a blue color filter and when the color filter pattern includes a blue color filter and a red color filter overlapping each other, respectively. FIG. 9 is a diagram illustrating luminance for each thickness of a light blocking pattern of the light leakage prevention pattern. FIG. 10 is a cross-sectional view taken along the line D-D' of FIG. 3. In the drawings, the backlight unit 30 of FIG. 2 and the external cover 20 of FIG. 1 will be omitted.

Referring to FIGS. 4 to 10, the display device 1 according to the exemplary embodiment includes the first display panel 100, the second display panel 200 facing the first display panel 100, a sealing member 300 attaching the first display panel 100 and the second display panel 200, and the liquid crystal layer 400 disposed between the first display panel 100 and the second display panel 200, as described above.

First, the first display panel 100 may include a first substrate 101, a gate wiring 110, a gate insulating layer 120, a semiconductor layer 130, a data wiring 140, a passivation layer 152, a color filter 160, a protective layer 154, a pixel electrode 180 (alternatively, referred to as a first electrode), a light blocking member 190, and a first polarizer 105.

The first substrate 101 may include the display area DA and the non-display area NDA described in FIG. 2. The display area DA may include a pixel area PA. The pixel area PA may be an area where the pixel element PX for driving one pixel is disposed. The pixel area PA may include a light transmitting area TA and a light blocking area BA. The pixel electrode 180 to be described below may be disposed on the light transmitting area TA of the pixel area PA and a switching element to be described below may be disposed on the light blocking area BA. The switching element may be, for example, a thin film transistor TFT.

The first substrate 101 may be made of transparent glass, plastic, or the like.

The gate wiring 110 is disposed on the light blocking area BA of the first substrate 101 and transmits a gate signal. The gate wiring 110 includes a gate line 112 extended in the first direction D1 and a gate electrode 114 protruding from the gate line 112 in a direction different from the first direction D1. The gate electrode 114 constitutes a semiconductor layer 130, a source electrode 142, a drain electrode 143, and a thin film transistor TFT, which will be described below.

The gate wiring 110 may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), and the like.

Further, the gate wiring 110 may have a multilayered structure including two conductive layers (not illustrated) having different physical properties. One conductive layer thereof may be made of a low-resistivity metal, for example, an aluminum-based metal, a silver-based metal, a copper-based metal, or the like so as to reduce the signal delay or the voltage drop of the gate wiring 110.

Unlike this, the other conductive layer may be made of a material having an excellent contact characteristic with other materials, particularly indium tin oxide (ITO) and indium zinc oxide (IZO), such as a molybdenum-based metal such as molybdenum (Mo) or a molybdenum alloy, chromium (Cr), tantalum (Ta), titanium (Ti), and the like. As a good example of the combination, a chromium lower film and an aluminum upper film, an aluminum lower film and a molybdenum upper film, and a titanium lower film and a copper upper film may be included. However, the inventive concept is not limited thereto, and the gate wiring 110 may be made of various metals and conductors.

The gate insulating layer 120 may be disposed on the first substrate 101 to cover the gate wiring 110. The gate insulating layer 120 may be disposed on the non-display area NDA as well as the display area DA of the first substrate 101. The gate insulating layer 120 may contain silicon oxide (SiOx) or silicon nitride (SiNx). Further, the gate insulating layer 120 may further contain aluminum oxide, titanium oxide, tantalum oxide or zirconium oxide.

The semiconductor layer 130 is disposed on the gate insulating layer 120 to form a channel of the thin film transistor TFT. The semiconductor layer 130 may be disposed to overlap at least the gate electrode 114. The semiconductor layer 130 may be made of amorphous silicon or an oxide semiconductor including at least one element of gallium (Ga), indium (In), tin (Sn), and zinc (Zn).

The data wiring 140 may be disposed on the semiconductor layer 130. The data wiring 140 may include a data line 141, a source electrode 142, and a drain electrode 143.

The data line 141 is disposed to be extended in a second direction D2 crossing the first direction D1 which is an extending direction of the gate line 112. The source electrode 142 is branched from the data line 141 and disposed to be extended on the semiconductor layer 130 overlapping the gate electrode 114. The drain electrode 143 is spaced apart from the source electrode 142 and disposed on the semiconductor layer 130 disposed to face the gate electrode 114 or the source electrode 142 based on the channel region of the thin film transistor TFT. The drain electrode 143 may be extended to overlap a part of the pixel electrode 180 on the semiconductor layer 130.

A passivation layer 152 may be disposed on the gate insulating layer 120, the semiconductor layer 130, the source electrode 142, and the drain electrode 143. The passivation layer 152 may be disposed even on the non-display area NDA as well as the display area DA of the first substrate 101. The passivation layer 152 may include an inorganic insulating material such as silicon oxide, silicon nitride, silicon oxynitride, and the like. The passivation layer 152 may protect the thin film transistor TFT and prevent a material included in a color filter 160 to be described below from flowing into the semiconductor layer 130.

The color filter 160 may be disposed on the passivation layer 152. The color filter 160 may be disposed to overlap the pixel area PA. In some exemplary embodiments, the color filter 160 may not overlap the light blocking area BA or may overlap only a part of the edge. Further, in some exemplary embodiments, the color filter 160 may not overlap a contact hole CH. The color filter 160 may be made of a photosensitive organic material containing a color material and constituted to include a red color filter 160a, a green color filter 160b, and a blue color filter 160c disposed in each pixel area PA.

The red color filter 160a, the green color filter 160b and the blue color filter 160c filter light provided from the backlight unit 30 and provide red, green, and blue light to each pixel area PA, respectively.

Meanwhile, a color filter 161a for forming a spacer may be formed on the color filter 160 in a region which overlaps the thin film transistor TFT. The color filter 161a for forming the spacer may implement a spacer using the light blocking member 190 without forming a separate spacer. The color filter 161a for forming the spacer may be formed of the same material as the blue color filter 160c at the same time when forming the blue color filter 160c, but is not limited thereto. The color filter 161a for forming the spacer may be formed of the same material as the red color filter 160a at the same time when forming the red color filter 160a or formed of the same material as the green color filter 160b at the same time when forming the green color filter 160b.

The protective layer 154 may be disposed on the color filter 160 and the color filter 161a for forming the spacer. The protective layer 154 may be disposed even on the non-display area NDA as well as the display area DA of the first substrate 101. In some exemplary embodiments, the protective layer 154 may be made of a photosensitive organic material.

The pixel electrode 180 may be disposed on the protective layer 154. The pixel electrode 180 may be disposed to overlap the light transmitting area TA of the pixel area PA. A part of the pixel electrode 180 is extended to overlap the light blocking area BA to be physically and electrically connected with the drain electrode 143 through the contact hole CH.

The pixel electrode 180 may include a transparent conductive material. For example, the pixel electrode 180 may include metal oxide such as indium zinc oxide, indium tin oxide, tin oxide, and zinc oxide.

The light blocking member 190 may be disposed on the protective layer 154. The light blocking member 190 is referred to as a black matrix, as a part for preventing light leakage. Particularly, the light blocking member 190 may include a light blocking portion 191 preventing light leakage and a spacer portion 192 functioning as a spacer together with the color filter 161a for forming the spacer.

In some exemplary embodiments, the light blocking member 190 may include a photosensitive organic material containing a light blocking material. The light blocking member 190 may be disposed to overlap the light blocking area BA and disposed not to overlap the light transmitting area TA. The light blocking member 190 may cover a portion of the thin film transistor TFT, the contact hole CH and the pixel electrode 180 overlapping the light blocking area BA. The light blocking member 190 may further overlap the gate wiring 110 and the data wiring 140. In some exemplary embodiments, the light blocking member 190 may be formed to be extended in the first direction D1. Meanwhile, although not illustrated, an alignment film may be further disposed on the light blocking member 190 and the pixel electrode 180.

The first polarizer 105 may be disposed on the display area DA of the lower surface of the first substrate 101. Illustratively, the first polarizer 105 may be disposed on the first substrate 101 to cover a part of the non-display area NDA of the first substrate 101.

The second panel 200 may include the second substrate 201, the common electrode 210 (alternatively, referred to as the second electrode), and the second polarizer 205.

The second substrate 201 may be made of transparent glass, plastic, or the like.

The common electrode 210 may be disposed on one surface facing the first display panel 100. The common electrode 210 may be made of a transparent conductor such as indium tin oxide (ITO) or indium zinc oxide (IZO). In some exemplary embodiments, the common electrode 210 may be entirely formed over the entire surface of the second substrate 201. A common voltage is applied to the common electrode 210 to form an electric field together with the pixel electrode 180. Meanwhile, although not illustrated, an alignment film may be further disposed on the common electrode 210.

The second polarizer 205 may be entirely disposed on the display area DA and the non-display area NDA of the upper surface of the second substrate 201. Accordingly, in the non-display area NDA, a non-overlapping region where the first polarizer 105 and the second polarizer 205 do not overlap each other may be formed.

The sealing member 300 attaches the first display panel 100 and the second display panel 200 to each other. The sealing member 300 may be disposed at a portion overlapping the non-display area NDA of the first display panel 100.

The liquid crystal layer 400 may include a plurality of liquid crystal molecules having dielectric anisotropy. When the electric field is applied between the first display panel 100 and the second display panel 200, the liquid crystal molecules may transmit or block light by rotating in a predetermined direction between the first display panel 100 and the second display panel 200.

Hereinafter, in the non-display area NDA, the light leakage prevention pattern LLP1 will be described in detail in the non-overlapping region where the first polarizer 105 and the second polarizer 205 do not overlap each other.

Referring to FIGS. 6 and 7, the light leakage prevention pattern LLP1 may be disposed in the non-overlapping region of the first polarizer 105 and the second polarizer 205 between the first substrate 101 and the second substrate 201. The light leakage prevention pattern LLP1 may be configured to include a color filter pattern 162a and a light blocking pattern 193 which overlap each other. The protective layer 154 may be disposed between the color filter pattern 162a and the light blocking pattern 193.

In FIGS. 6 and 7, wirings 116 and 146 indicate wirings and the like, wirings 116 may be formed at the same time when the gate wiring 110 (FIG. 4) is formed and wiring 146 may be formed at the same time when the data wiring 140 (FIG. 4) is formed.

The color filter pattern 162a may be disposed to completely overlap the light blocking pattern 193. Illustratively, the color filter pattern 162a may have a structure covered by the light blocking pattern 193. Further, the color filter pattern 162a may be disposed not to overlap the sealing member 300. The sealing member 300 may be disposed outside the color filter pattern 162a.

The color filter pattern 162a may include any one of the red color filter 160a, the green color filter 160b, and the blue color filter 160c of the display area DA, e.g., material thereof. Illustratively, the color filter pattern 162a may include the blue color filter 160c. That is, the color filter pattern 162a may be formed of the same material as the blue color filter 160c when the blue color filter 160c is formed. When the color filter pattern 162a includes the blue color filter 160c, the light blocking effect of the light leakage prevention pattern LLP1 is large. A thickness t1 of the color filter pattern 162a may be about 2.2 µm to about 2.6 µm. Further, although not illustrated, the color filter pattern 162a may include a multilayer including the blue color filter 160c and other color filters 160a or 160b. Illustratively, the color filter pattern 162a may be configured to include the blue color filter 160c and the red color filter 160a or include the blue color filter 160c and the green color filter 160b. Even in this case, the light blocking effect of the light leakage prevention pattern is large.

Through an experimental result of FIG. 8, it can be seen that the color filter pattern 162a includes the blue color filter 160c, the light blocking effect of the light leakage prevention pattern is large and when the color filter pattern 162a includes the multilayer including the blue color filter 160c and the green color filter 160b, the light blocking effect of the light leakage prevention pattern is large.

FIG. 8 is a diagram illustrating luminance when a color filter pattern of a light leakage prevention pattern includes a red color filter, a green color filter, and a blue color filter and when the color filter pattern includes a blue color filter and a red color filter overlapping each other, respectively.

In FIG. 8, the luminance is luminance in a structure including one polarizer and a light leakage prevention pattern (a light blocking pattern and a color filter pattern), ① is a case where the color filter pattern of the light leakage prevention pattern is a red color filter, ② is a case where the color filter pattern of the light leakage prevention pattern is a green color filter, ③ is a case where the color filter pattern of the light leakage prevention pattern is a blue color filter, and ④ is a case where the color filter pattern of the light leakage prevention pattern is configured to include the blue color filter and the red color filter which overlap each other. ⓡ is reference luminance as luminance of light irradiated as the light leakage prevention pattern.

As illustrated in FIG. 8, the luminance of ① is about 0.068 nit, the luminance of ② is about 0.046 nit, the luminance of ③ is about 0.016 nit, and the luminance of ④ is about 0.011 nit, and it was measured that the luminance in the cases ③ and ④ where the light leakage prevention pattern included the blue color filter was low. Considering the fact that the lower the luminance value is, the greater the effect of blocking light is, like the cases of ③ and ④, it can be seen that when the color filter pattern of the light leakage prevention pattern includes the blue color pattern, the light leakage prevention effect is large.

The light blocking pattern 193 may be disposed on the color filter pattern 162a. Illustratively, the light blocking pattern 193 overlaps the sealing member 300 to adjust the length of the sealing member 300 between the first display panel 100 and the second display panel 200.

The light blocking pattern 193 may be formed of the same material as the light blocking member 190 when the light blocking member 190 disposed in the display area DA is formed. The light blocking member 190 may be formed using a full-tone exposure mask and include an epoxy acrylate-based polymer. As such, a thickness t2 of the light blocking pattern 193 formed together with the light blocking member 190 may be about 2.9 µm to about 3.8 µm. When the light blocking pattern 193 has the thickness t2 and the color filter pattern 162a has the thickness t1, the light blocking effect of the light leakage prevention pattern LLP1 is large.

Through the experimental result of FIG. 9, it can be seen that when the light blocking pattern 193 has the thickness t2, the light blocking effect of the light leakage prevention pattern LLP1 is large.

FIG. 9 is a diagram illustrating luminance for each thickness of the light blocking pattern of the light leakage prevention pattern.

In FIG. 9, the luminance is luminance in a structure of including one polarizer and a light leakage prevention pattern (a light blocking pattern and a color filter pattern including a blue color filter), (I) is case where the thickness t2 of the light blocking pattern 193 is 2.7 µm, (II) is case where the thickness t2 of the light blocking pattern 193 is 2.9 µm, (III) is case where the thickness t2 of the light blocking pattern 193 is 3.4 µm, (IV) is case where the thickness t2 of the light blocking pattern 193 is 3.8 µm, and (V) is case where the thickness t2 of the light blocking pattern 193 is 4 µm. 0 is reference luminance, as luminance of light irradiated as the light leakage prevention pattern. In the cases of (I) to (IV), the color filter pattern of the light leakage prevention pattern includes a single blue color filter, and in the case (V), the color filter pattern of the light leakage prevention pattern includes a blue color filter and a green color filter which overlap each other.

As illustrated in FIG. 9, the luminance of (I) is about 0.058 nit, the luminance of (II) is about 0.051 nit, the luminance of (III) is about 0.024 nit, the luminance of (IV) is about 0.018 nit, and the luminance of (V) is about 0.011 nit, and it can be seen that when the thickness t2 of the light blocking pattern 193 is small as 2.7 µm, the light leakage degree is large, and thus the luminance is largely measured. Accordingly, a case where the light blocking pattern 193 is formed to have a thickness larger than 2.7 µm, for example, equal to or larger than 2.9 µm may be applied. However, when the thickness t2 of the light blocking pattern 193 is too large, a step between the light leakage prevention pattern and the peripheral configuration occurs, and thus, a case where the light blocking pattern 193 is formed to have a thickness t2 of 3.8 µm or less may be applied. Meanwhile, an end portion of the first polarizer 105 may overlap the color filter pattern 162a with a predetermined width DW. As a result, it is possible to prevent light from being stably leaked from the end portion of the first polarizer 105.

Meanwhile, FIG. 10 illustrates that the light leakage prevention pattern LLP1 is equally applied to a portion where the gate driver 800 (FIG. 3) is implemented by, for example, an amorphous silicon gate (ASG) scheme. The gate driver 800 (FIG. 3) may include wirings 116a, 146a, and 186. The wiring 116a may be formed together when the gate wiring 110 (FIG. 4) is formed, the wiring 146a may be formed together when the data wiring 140 (FIG. 4) is formed, and the wiring 186 may be formed together when the pixel electrode 180 (FIG. 4) is formed.

As such, in the display device 1 according to the exemplary embodiment, it is possible to reduce the light leakage in the non-overlapping region where the first polarizer 105 and the second polarizer 205 do not overlap each other through a stacked structure of the color filter pattern 162a and the light blocking pattern 193 of the light leakage prevention pattern LLP1.

Accordingly, the light leakage is reduced at the edge portion of the display device 1, thereby improving the display quality of the display device 1.

FIGS. 11 to 17 are cross-sectional views illustrating various examples of the portion taken along the line C-C' of FIG. 3.

Figure 11:
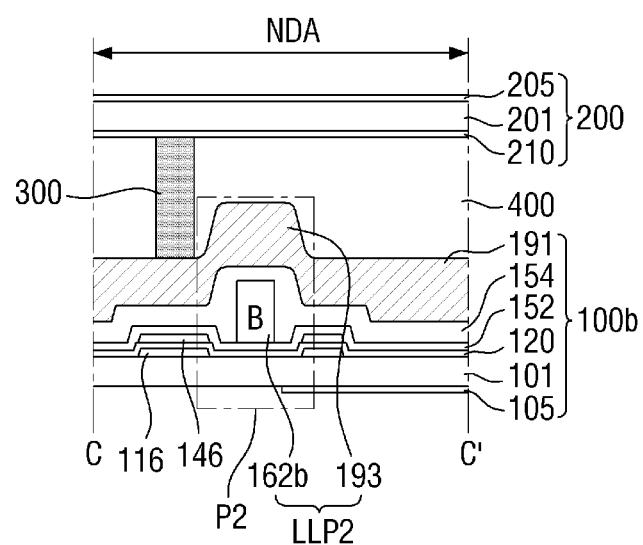
FIGS. 11, 12, 13, 14, 15, 16, and 17 are cross-sectional views illustrating various examples of the portion taken along the line C-C' of FIG. 3.
Figure 12:
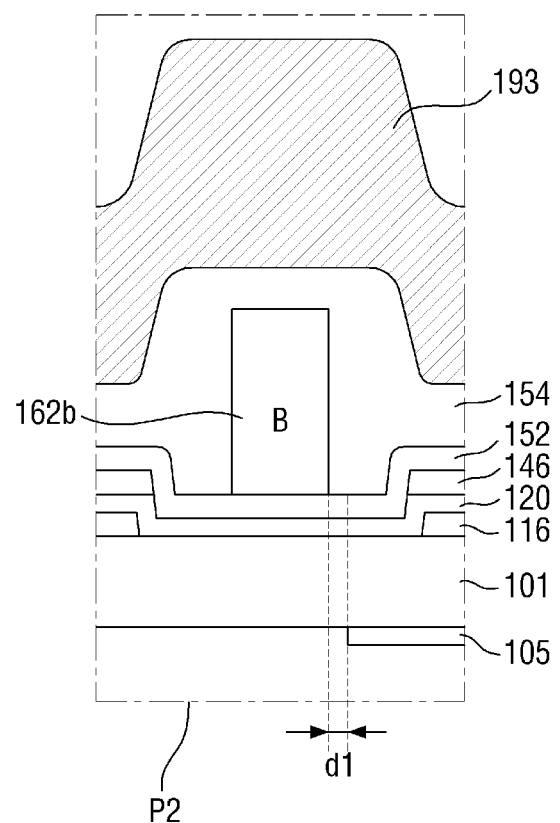

FIGS. 11 and 12 illustrate that a light leakage prevention pattern LLP2 of a first display panel 100b includes a color filter pattern 162b and a light blocking pattern 193. FIG. 12 is a cross-sectional view enlarging a portion P2 of FIG. 11.

The color filter pattern 162b is similar to the color filter pattern 162a of FIG. 6. However, the color filter pattern 162b does not overlap the first polarizer 105. For example, a separation distance d1 between an end portion of the first polarizer 105 and an end portion of the color filter pattern 162b may be about 0.5 mm or less. In a range of the separation distance d1, the light leakage is almost not viewed.

Figure 13:
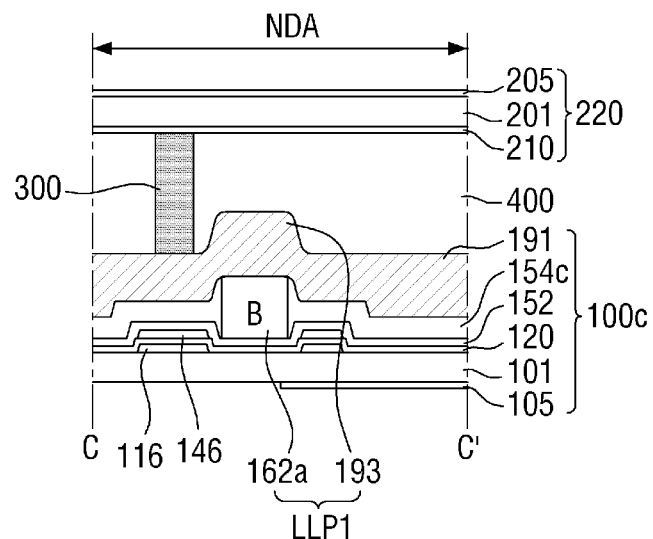

FIG. 13 illustrates that a protective layer 154c of a first display panel 100c is removed from a region where the light leakage prevention pattern LLP1 is formed, as compared with the first display panel 100 of FIG. 6. When a cell gap keeping spacer is formed using a color filter 161a for forming a spacer and a spacer portion 192 in the display area (DA of FIG. 5), the cell gap keeping spacer with a desired length may be formed by adjusting the thickness of the protective layer 154c. Herein, the color filter pattern 162a and the light blocking pattern 193 may directly contact each other.

Figure 14:
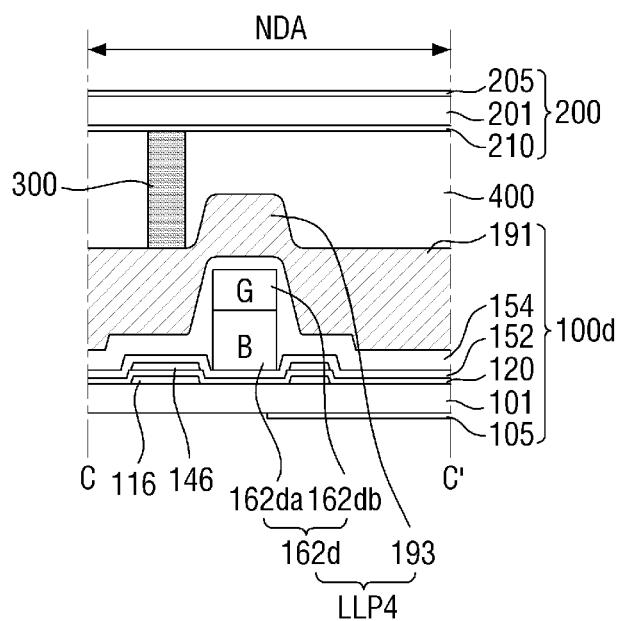

FIG. 14 illustrates that a light leakage prevention pattern LLP4 of a first display panel 100d includes a double-layered color filter pattern 162d, as compared with the first display panel 100 of FIG. 6. In this case, the light blocking effect of the light leakage prevention pattern LLP4 may be large.

The color filter pattern 162d may include a first color filter pattern 162da and a second color filter pattern 162db which are stacked each other. The first color filter pattern 162da may include a blue color filter and the second color filter pattern 162db may include a green color filter.

Meanwhile, when the color filter pattern 162d includes a triple layer or more, a height of the light blocking member 190 (FIG. 5) may be increased to an undesired height or more in the display area DA (FIG. 5). Particularly, when a spacer portion for keeping the cell gap in the light blocking member 190 (FIG. 5) becomes larger than the undesired height, the cell gap between the first display panel 100 and the second display panel 200 is increased. Accordingly, defects such as a region where the liquid crystal is not filled or a region where the liquid crystal does not spread uniformly may occur, and as a result, the display quality of the display device may be deteriorated.

Figure 15:
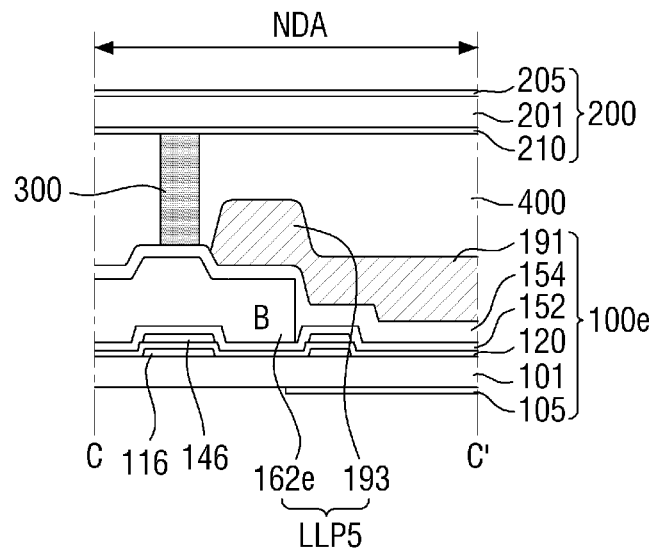

FIG. 15 illustrates that a light leakage prevention pattern LLPS of a first display panel 100e includes a color filter pattern 162e overlapping with the sealing member 300, as compared with the first display panel 100 of FIG. 6. The color filter pattern 162e may adjust the length of the sealing member 300 of attaching the first display panel 100e and the second display panel 200 instead of the light blocking pattern 193 of FIG. 6. Accordingly, in FIG. 15, the light blocking pattern 193 of the light leakage prevention pattern LLPS does not overlap the sealing member 300. The sealing member 300 may be disposed outside the light blocking pattern 193.

Figure 16:
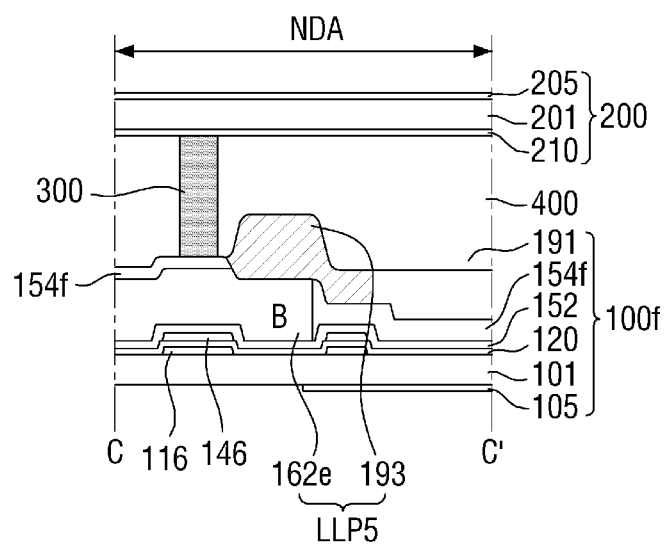

FIG. 16 illustrates that a protective layer 154f of a first display panel 100f is removed from a region where the light leakage prevention pattern LLPS is formed, as compared with the first display panel 100e of FIG. 15. This has a similar reason to the contents described in FIG. 13.

Figure 17:
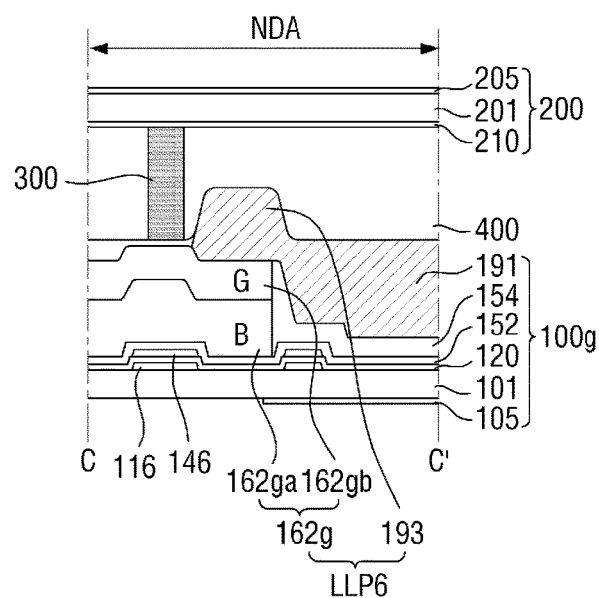

FIG. 17 illustrates that a light leakage prevention pattern LLP6 of a first display panel 100g includes a double-layered color filter pattern 162g, as compared with the first display panel 100e of FIG. 15. In this case, the light blocking effect of the light leakage prevention pattern LLP6 may be large.

The color filter pattern 162g may include a first color filter pattern 162ga and a second color filter pattern 162gb which are stacked each other. The first color filter pattern 162ga may include a blue color filter and the second color filter pattern 162gb may include a green color filter.

Figure 18:
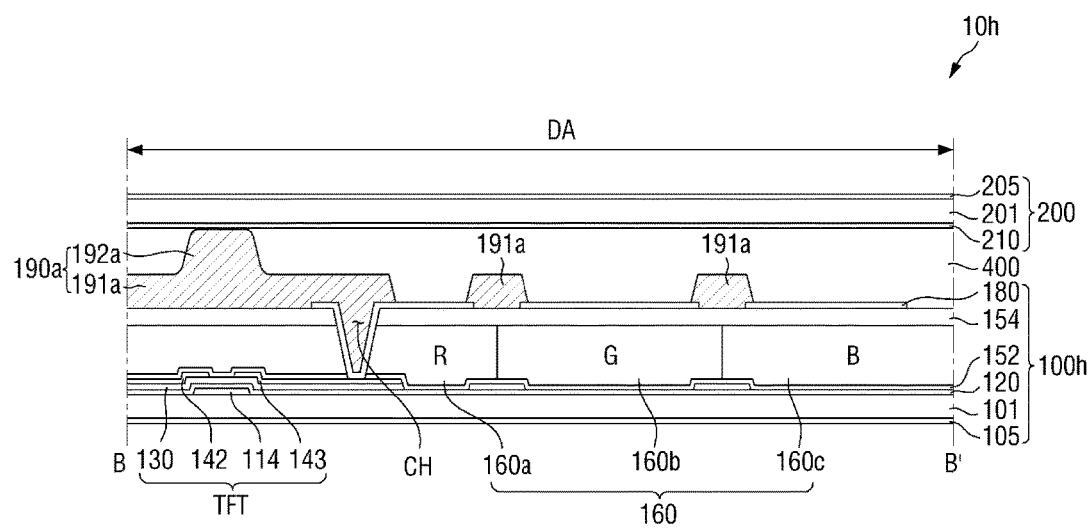
FIG. 18 is a cross-sectional view illustrating a display device taken along the line B-B' of FIG. 4 according to another exemplary embodiment.

FIG. 18 is a cross-sectional view illustrating a display device according to another exemplary embodiment.

FIG. 18 illustrates that a first display panel 100h of a display panel 10h includes a light blocking member 190a formed using a half-tone exposure mask, as compared with the display panel 10 of FIG. 5. The light blocking member 190a may include a light blocking portion 191a and a spacer portion 192a. The light blocking portion 191a may include a cardo-based polymer and an acryl-based polymer.

Although not illustrated, a portion taken along the line C-C' of FIG. 3 in the display panel 10h is similar to the structure of FIG. 6.

Figure 19:
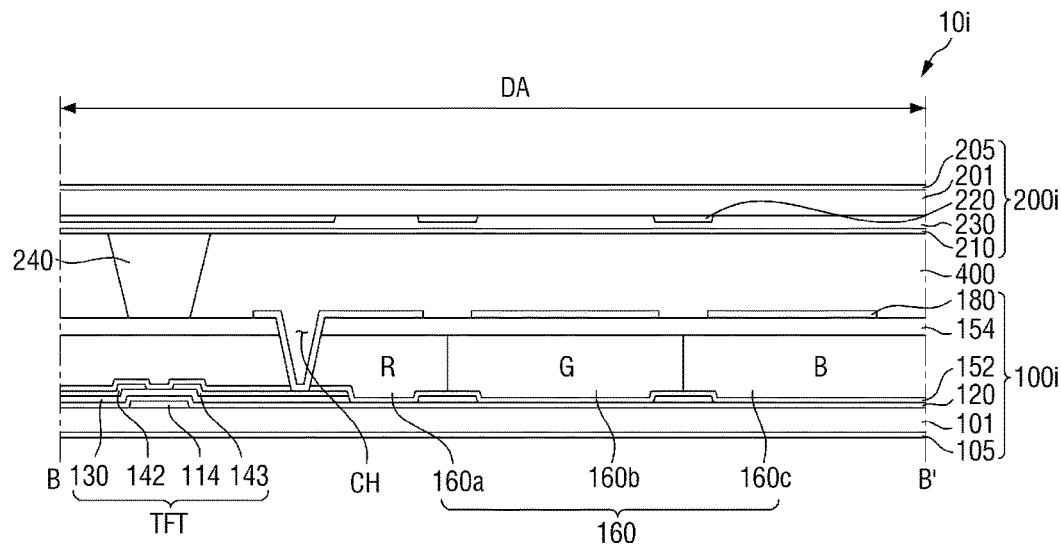
FIG. 19 is a cross-sectional view illustrating a display device taken along the line B-B' of FIG. 4 according to yet another exemplary embodiment.
Figure 20:
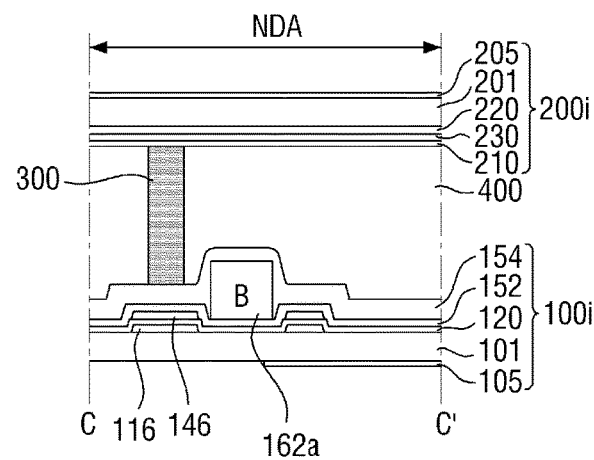
FIG. 20 is a cross-sectional view illustrating the display device of FIG. 19 taken along the line C-C' of FIG. 3.

FIG. 19 is a cross-sectional view illustrating a display device taken along the line B-B' of FIG. 4 according to yet another exemplary embodiment and FIG. 20 is a cross-sectional view illustrating the display device of FIG. 19 taken along the line C-C' of FIG. 3.

Referring to FIGS. 19 and 20, a display panel 10i includes a first display panel 100i and a second display panel 200i.

The first display panel 100i is different from the first display panel 100 of FIGS. 5 and 6 only in that the light blocking member 190 of FIG. 5 is not included, and has a similar configuration.

The second display panel 200i is different from the second display panel 200 of FIGS. 5 and 6 only in that a light blocking member 220, an overcoating layer 230 and a column spacer 240 are included, and has a similar configuration.

The light blocking member 220 is disposed between the second substrate 201 and the common electrode 210 and may overlap the thin film transistor TFT, the gate line 112 (FIG. 4), and the data line 141 (FIG. 4). The light blocking member 220 blocks unnecessary light when an image is displayed on the display panel 10i.

The overcoating layer 230 is disposed between the light blocking member 220 and the common electrode 210 to cover the light blocking member 220. The overcoating layer 230 serves to protect or insulate the light blocking member 220 and provides a flat surface. The overcoating layer 230 may be formed using an acryl-based epoxy material.

The column spacer 240 may be disposed to keep a cell gap between the common electrode 210 and the pixel electrode 180. The column spacer 240 may overlap the thin film transistor TFT.

Meanwhile, as illustrated in FIG. 20, in the non-display area NDA, the light leakage prevention pattern disposed in the non-overlapping region where the first polarizer 105 and the second polarizer 205 do not overlap each other may be implemented when the color filter pattern 162a of the first display panel 100i and the light blocking member 220 disposed in the non-display area NDA overlap each other.

Although not illustrated, the color filter pattern 162a may be modified as the color filter pattern of the above exemplary embodiments.

Figure 21:
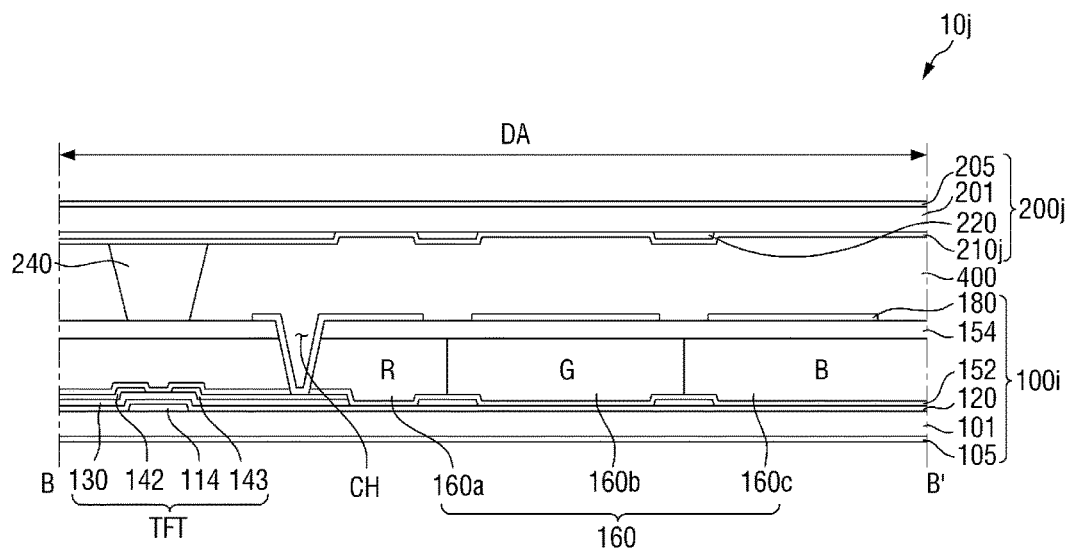
FIG. 21 is a cross-sectional view illustrating the display device taken along the line B-B' of FIG. 4 according to yet another exemplary embodiment.
Figure 22:
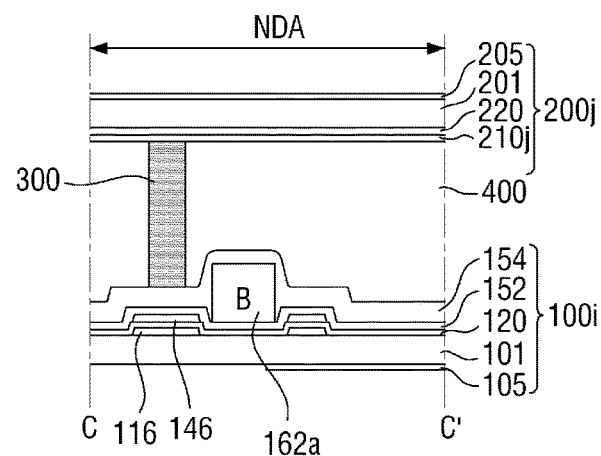
FIG. 22 is a cross-sectional view illustrating the display device of FIG. 21 taken along the line C-C' of FIG. 3.

FIG. 21 is a cross-sectional view illustrating a display device taken along the line B-B' of FIG. 4 according to yet another exemplary embodiment and FIG. 22 is a cross-sectional view illustrating the display device of FIG. 21 taken along the line C-C' of FIG. 3.

Referring to FIGS. 21 and 22, a display panel 10j includes a first display panel 100i and a second display panel 200j.

The second display panel 200j is similar to the second display panel 200i of FIGS. 19 and 20 only in that the overcoating layer is omitted. The common electrode 210j contacts the light blocking member 220 by the structure and may have a curved portion.

Meanwhile, even in FIG. 22, as illustrated in FIG. 20, in the non-display area NDA, the light leakage prevention pattern disposed in the non-overlapping region where the first polarizer 105 and the second polarizer 205 do not overlap each other may be implemented when the color filter pattern 162a of the first display panel 100i and the light blocking member 220 disposed in the non-display area NDA overlap each other.

Although not illustrated, the color filter pattern 162a may be modified as the color filter pattern of the above exemplary embodiments.

As described above, according to the exemplary embodiments, it is possible to provide a display device capable of improving display quality by reducing the occurrence of light leakage in a non-overlapping region of a first polarizer and a second polarizer.

The features of the inventive concept are not limited by the foregoing, and other various features are anticipated herein.

Further, in the above description, the inventive concept has been described based on the exemplary embodiments, but the exemplary embodiments are illustrative, and do not limit the inventive concept, and those skilled in the art will appreciate that various modifications and applications, which are not exemplified in the above description, may be made without departing from the scope of the essential characteristic of the exemplary embodiments. For example, each component described in detail in the exemplary embodiment can be modified and executed. In addition, it should be construed that differences associated with the modifications and applications are included in the scope of the inventive concept defined in the accompanying claims.

What is claimed is:

1. A display device, comprising:
   a first substrate and a second substrate including a display area and a non-display area surrounding the display area, the first substrate and the second substrate facing and attached to each other;

a first polarizer disposed on the display area of the first substrate;

a second polarizer entirely disposed on the display area and the non-display area of the second substrate and having a non-overlapping region which does not overlap with the first polarizer in the non-display area; and a light leakage prevention pattern in the non-display area and disposed between the first substrate and the second substrate in the non-overlapping region of the first polarizer and the second polarizer and including a color filter pattern and a light blocking pattern which overlap each other, wherein an end portion of the first polarizer overlaps with the color filter pattern.

2. The display device of claim 1, wherein the color filter pattern completely overlaps the light blocking pattern.

3. The display device of claim 1, wherein the color filter pattern is one of a blue color filer, a green color filter, a blue color filter and a green color filter overlapping each other, and a blue color filter and a red color filter overlapping each other.

4. The display device of claim 1, further comprising:
a sealing member disposed between the first substrate and the second substrate in the non-display area and attaching the first substrate and the second substrate to each other.

5. The display device of claim 4, wherein the sealing member is disposed outside the color filter pattern and does not overlap the color filter pattern.

6. The display device of claim 4, wherein the sealing member is disposed outside the light blocking pattern, overlaps the color filter pattern, and does not overlap the light blocking pattern.

7. The display device of claim 1, wherein the color filter pattern and the light blocking pattern directly contact each other.

8. The display device of claim 1, further comprising:
a gate wiring disposed on the display area of the first substrate and a data wiring insulatively crossing the gate wiring;

a switching element disposed on the display area of the first substrate and connected with the gate wiring and the data wiring;

a passivation layer disposed on the switching element;

a first electrode disposed on the passivation layer and connected to the switching element;

a color filter disposed between the first substrate and the first electrode and overlapping the first electrode; and a protective layer disposed between the color filter and the first electrode.

9. The display device of claim 8, wherein the color filter is one of a red color filter, a green color filter, and a blue color filter, and the color filter pattern is formed of a same material as the color filter.

10. The display device of claim 8, further comprising:
a light blocking member which is disposed on the protective layer, overlaps the switching element, and is made of a same material as the light blocking pattern.

11. The display device of claim 10, wherein the light blocking member includes an epoxy acrylate-based polymer.

12. The display device of claim 10, wherein the light blocking member includes a cardo-based polymer and an acrylate-based polymer.

13. The display device of claim 8, further comprising:
a light blocking member which is disposed on the second substrate, overlaps the switching element, and is made of a same material as the light blocking pattern.

14. The display device of claim 1, wherein the light blocking pattern has a thickness of about 2.9 µm to about 3.8 µm and the color filter pattern has a thickness of about 2.2 µm to about 2.6 µm.

15. The display device of claim 1, further comprising:
a middle cover including a bottom portion covering a part of a lower portion of the first substrate and the second substrate bonded to each other and a side wall portion covering a side portion of the first substrate and the second substrate bonded to each other, wherein an end portion of the bottom portion and an end portion of the first polarizer are spaced apart from each other.

16. A display device, comprising:
a first substrate including a display area and a non-display area surrounding the display area;

a first polarizer disposed on the display area of the first substrate; and a light leakage prevention pattern in the non-display area and disposed outside the first polarizer on the non-display area of the first substrate and including a color filter pattern and a light blocking pattern overlapping each other, wherein an end portion of the first polarizer overlaps the color filter pattern.

17. The display device of claim 16, wherein the color filter pattern completely overlaps the light blocking pattern.

18. The display device of claim 16, wherein the color filter pattern is one of a blue color filer, a green color filter, a blue color filter and a green color filter overlapping each other, and a blue color filter and a red color filter overlapping each other.

* * * * *